United States Patent
Sung

(10) Patent No.: US 10,186,621 B2
(45) Date of Patent: Jan. 22, 2019

(54) SOLAR CELL

(71) Applicant: LG INNOTEK CO., LTD., Seoul (KR)

(72) Inventor: Myoung Seok Sung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 22 days.

(21) Appl. No.: 15/026,465

(22) PCT Filed: Sep. 26, 2014

(86) PCT No.: PCT/KR2014/009065
§ 371 (c)(1),
(2) Date: Mar. 31, 2016

(87) PCT Pub. No.: WO2015/050340
PCT Pub. Date: Apr. 9, 2015

(65) Prior Publication Data
US 2016/0247947 A1    Aug. 25, 2016

(30) Foreign Application Priority Data

Oct. 2, 2013  (KR) .................. 10-2013-0118218

(51) Int. Cl.
*H01L 31/032* (2006.01)
*H01L 31/046* (2014.01)
(Continued)

(52) U.S. Cl.
CPC .. *H01L 31/022425* (2013.01); *H01L 31/0322* (2013.01); *H01L 31/03923* (2013.01);
(Continued)

(58) Field of Classification Search
CPC ..... Y02E 10/50; Y02E 10/541; Y02E 10/543; H01L 31/022425; H01L 31/03923; H01L 31/0322
(Continued)

(56) References Cited

U.S. PATENT DOCUMENTS

2001/0037825 A1   11/2001   Nakano et al.
2007/0186971 A1    8/2007   Lochun et al.
(Continued)

FOREIGN PATENT DOCUMENTS

CN    102473750 A    5/2012
CN    102598299 A    7/2012
(Continued)

OTHER PUBLICATIONS

Office Action dated Nov. 2, 2016 in Chinese Application No. 201480054827.9.
(Continued)

*Primary Examiner* — Liesl C Baumann
(74) *Attorney, Agent, or Firm* — Saliwanchik, Lloyd & Eisenschenk

(57) ABSTRACT

The present disclosure provides a solar cell device comprising; a support substrate; a rear electrode layer on the substrate; a light absorption layer on the rear electrode layer; a front electrode layer on the light absorption layer; and wherein a first through-hole is defined in the rear electrode layer; wherein at least one protrusion is formed on an exposed top face of the substrate via the first through-hole.

9 Claims, 4 Drawing Sheets

(51) Int. Cl.
    *H01L 31/0224* (2006.01)
    *H01L 31/0392* (2006.01)
    *H01L 31/0463* (2014.01)
(52) U.S. Cl.
    CPC ........ *H01L 31/046* (2014.12); *H01L 31/0463* (2014.12); *Y02E 10/50* (2013.01); *Y02E 10/541* (2013.01)
(58) Field of Classification Search
    USPC .................................................. 136/243–265
    See application file for complete search history.

(56) References Cited

U.S. PATENT DOCUMENTS

| | | | |
|---|---|---|---|
| 2008/0216895 | A1 | 9/2008 | Aoki et al. |
| 2009/0194150 | A1* | 8/2009 | Aoki ................... H01L 31/0236 136/252 |
| 2011/0092014 | A1 | 4/2011 | Sheats et al. |
| 2011/0186103 | A1* | 8/2011 | Kobayashi ........ H01L 31/03928 136/244 |
| 2011/0308606 | A1* | 12/2011 | Hsieh .................. H01L 31/0392 136/258 |
| 2012/0097242 | A1 | 4/2012 | Lee |
| 2012/0097244 | A1 | 4/2012 | Adachi et al. |
| 2012/0103416 | A1* | 5/2012 | Kwon ............. H01L 31/022425 136/256 |
| 2012/0167954 | A1 | 7/2012 | Meakin et al. |
| 2012/0199191 | A1 | 8/2012 | Lim |
| 2012/0291853 | A1* | 11/2012 | Lee ................. H01L 31/022466 136/249 |
| 2016/0133765 | A1 | 5/2016 | Adachi et al. |

FOREIGN PATENT DOCUMENTS

| | | |
|---|---|---|
| CN | 103329281 A | 9/2013 |
| JP | 2007317879 A | 12/2007 |
| KR | 20110047726 A | 5/2011 |

OTHER PUBLICATIONS

International Search Report in International Application No. PCT/KR2014/009065, filed Sep. 26, 2014.

* cited by examiner

SOLAR CELL

CROSS-REFERENCE TO RELATED APPLICATION

This application is the U.S. national stage application of International Patent Application No. PCT/KR2014/009065, filed Sep. 26, 2014, which claims priority to Korean Application No. 10-2013-0118218, filed Oct. 2, 2013, the disclosures of each of which are incorporated herein by reference in their entirety.

BACKGROUND

Field of the Present Disclosure

Embodiment of the present disclosure relates to a solar cell device.

Discussion of the Related Art

A method for manufacturing a solar cell device for electric generation using a solar energy may be as follows: first, a substrate is prepared, on which a rear electrode layer is formed. Then, the electrode layer is patterned using a laser to form a number of rear sub-electrodes.

Thereafter, on the rear sub-electrodes, a light absorption layer, a buffer layer, and a high resistance buffer layer are formed in this order. In order to form the light absorption layer, two approaches has been widely employed: in a first one, by evaporating copper, indium, gallium, and selenium at the same time or individually, a copper-indium-gallium-selenide ($Cu(In,Ga)Se_2$; CIGS) based light absorption layer is formed; and in a second one, a metal precursor layer is formed, and, thereafter, a selenization process is conducted to the precursor layer to form the light absorption layer. The light absorption layer has an energy band gap of about 1 eV to 1.8 eV.

Next, on the light absorption layer, a buffer layer including a cadmium sulfide (CdS) is formed using a sputtering process. The buffer layer has an energy band gap of about 2.2 eV to 2.4 eV. Then, on the buffer layer, a high resistance buffer layer including a zinc oxide (ZnO) is formed using a sputtering process. The high resistance buffer layer has an energy band gap of about 3.1 eV to 3.3 eV.

After this, groove patterns are formed in a stack of the light absorption layer, the buffer layer and the high resistance buffer layer.

Next, on the high resistance buffer layer, a transparent conductive material is disposed so as to fill the groove patterns. In this way, on the high resistance buffer layer, a transparent electrode layer is formed, and, at the same time, the conductive material filling the groove patterns serves as connection lines respectively. The transparent electrode layer and connection line may be made of, for example, a zinc oxide doped with aluminum. The transparent electrode layer has an energy band gap of about 3.1 eV to 3.3 eV.

Then, on the transparent electrode layer, further groove patterns are formed to form a number of solar cells. Each of the transparent electrodes and the high resistance buffers may correspond to each of the solar cells. The transparent electrodes and the high resistance buffers may be arranged in stripes or matrix form.

The transparent electrodes and the rear sub-electrodes are misaligned with each other. Thus, the transparent electrodes and the rear sub-electrodes may be electrically coupled to each other via the connection lines respectively. In this way, the number of the solar cells may be electrically coupled to each other in a series.

The light absorption layer is formed the rear electrode layer. Specifically, the light absorption layer is formed on the patterned rear electrode layer.

However, after deposition of the light absorption layer, due to a poor bonding force between the light absorption layer and rear electrode layer, and/or the light absorption layer and support substrate in the patterned regions of the rear electrode layer, the light absorption layer may be peeled off from the rear electrode layer and support substrate. This may lead to an increase in an overall electrical resistance of the solar cells, and, thus, deterioration in an overall generation efficiency of the solar cells.

Therefore, there is a need for a solar cell structure with prevention of the light absorption layer from being peeled off.

BRIEF SUMMARY

The present disclosure provides a novel solar cell structure with improved photovoltaic efficiency.

In an aspect of the present disclosure, there is provided a solar cell device comprising; a support substrate; a rear electrode layer on the substrate; a light absorption layer on the rear electrode layer; a front electrode layer on the light absorption layer; and wherein a first through-hole is defined in the rear electrode layer; wherein at least one protrusion is formed on an exposed top face of the substrate via the first through-hole.

In accordance with the present disclosure, the solar cell structure may be configured such that the protrusions formed on an exposed top face of the support substrate through the first through-grooves contain a mixture of molybdenum and molybdenum diselenide.

In particular, each of the protrusions may have a content configuration such that the molybdenum diselenide content increases toward a top portion thereof, that is, the light absorption layer. This may lead to an improved bonding force between the light absorption layer and support substrate in each of the first through-grooves.

In this way, the improved bonding force between the support substrate and light absorption layer may prevent the deposited light absorption layer from being peeled off. The solar cell structure of the present disclosure may have improved overall photovoltaic efficiency.

BRIEF DESCRIPTIONS OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure. In the drawings.

DETAILED DESCRIPTION

Figure 1:
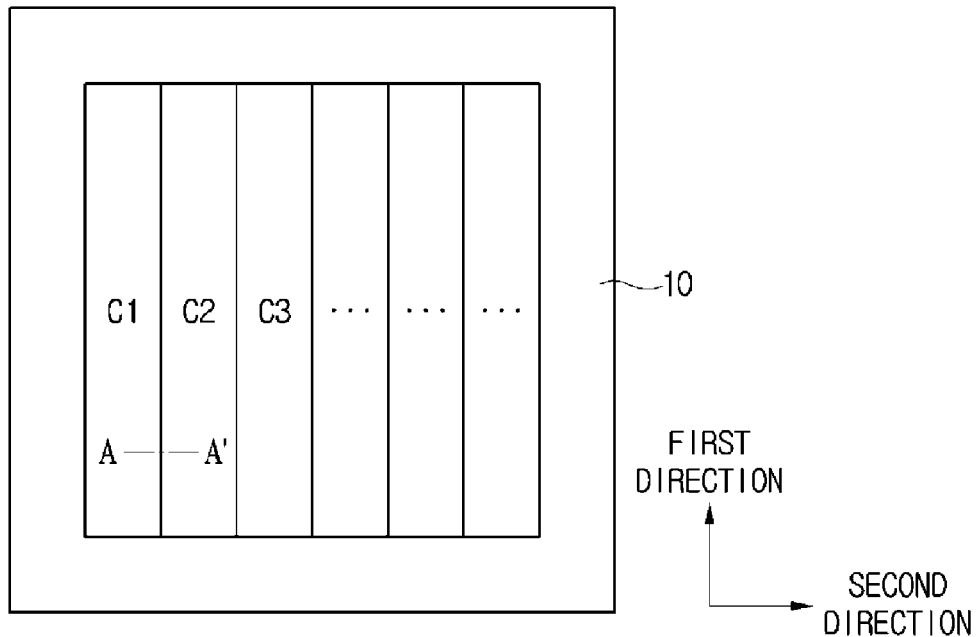
FIG. 1 illustrates a top view of a solar cell panel of one embodiment of the present disclosure.

Examples of various embodiments are illustrated in the accompanying drawings and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired properties sought to be obtained by the practice of the present disclosure. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 6.3, or 5.5 to 10, or 2.7 to 6.1.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

Hereinafter, various embodiments of the present disclosure will be described in details with reference to attached drawings.

Figure 2:
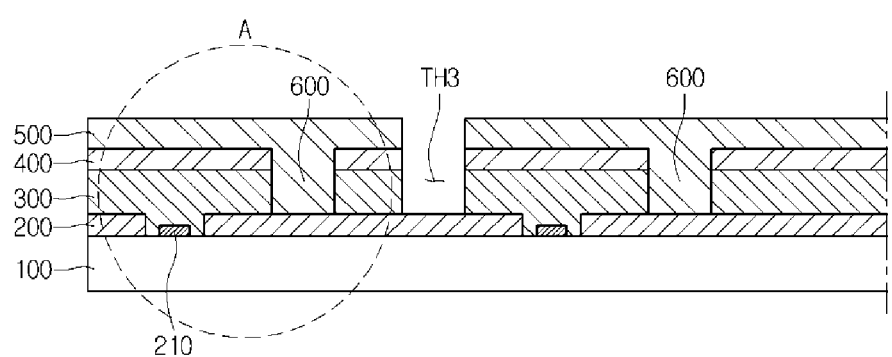
FIG. 2 illustrates a cross-sectional view of a solar cell structure of one embodiment of the present disclosure.
Figure 3:
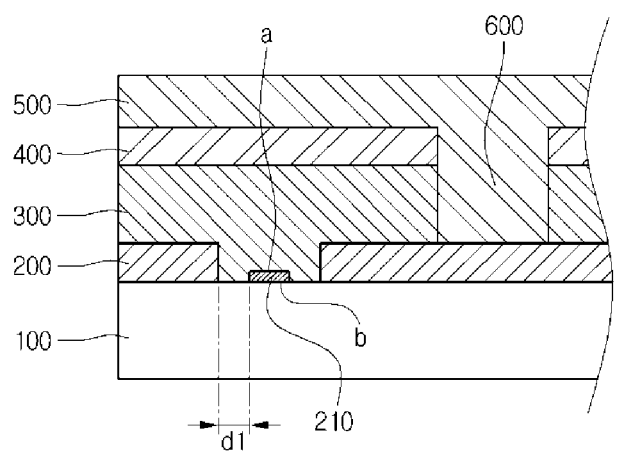
FIG. 3 illustrates an enlarged cross-sectional view of an "A" portion of FIG. 2.
Figure 4:
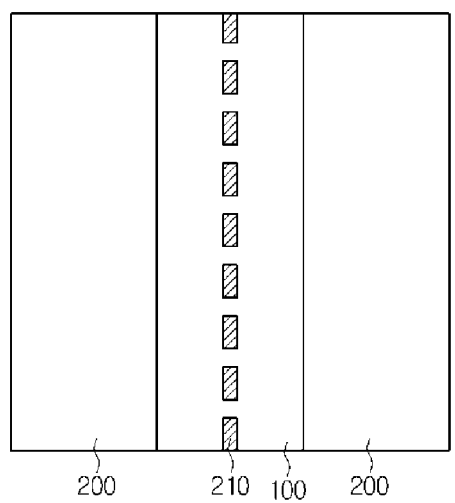
FIG. 4 and FIG. 5 illustrate respective top views describing various forms of protrusions.
Figure 5:
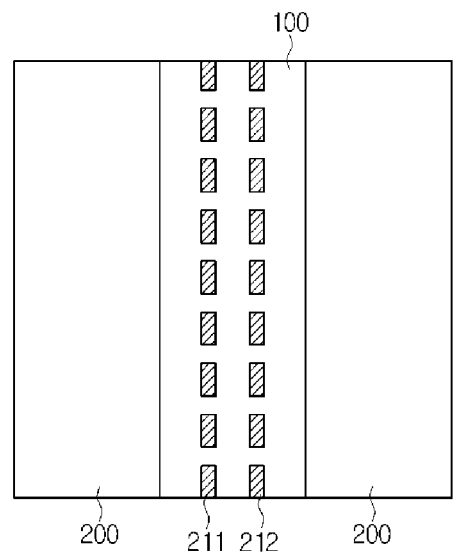

Referring to FIG. 1 to FIG. 5, a solar cell structure of one embodiment will be described in details. FIG. 1 illustrates a top view of a solar cell panel of one embodiment. FIG. 2 illustrates a cross-sectional view of a solar cell structure of one embodiment. FIG. 3 illustrates an enlarged cross-sectional view of an "A" portion of FIG. 2. FIG. 4 and FIG. 5 illustrate respectively respective top views describing various forms of protrusions.

Referring to FIG. 1 to FIG. 5, a solar cell structure of one embodiment includes a support substrate 100, a rear electrode layer 200, a light absorption layer 300, a buffer layer 400, a front electrode layer 500, and a multiple of connections 600.

The support substrate 100 may have a plate shape. The substrate 100 supports the rear electrode layer 200, the light absorption layer 300, the buffer layer 400, the front electrode layer 500, and the connection 600.

The support substrate 100 may be made of an insulating material. The support substrate 100 may be made of a glass, a plastic, or a metal. Specifically, the support substrate 100 may be made of a soda lime glass. The support substrate 100 may be transparent. The support substrate 100 may be rigid or flexible.

The rear electrode layer 200 is disposed on the support substrate 100. The rear electrode layer 200 is electrically conductive. The rear electrode layer 200 may be made of a metal such as molybdenum, etc.

The rear electrode layer 200 may be formed in a stack of layers. In this case, the layers of the stack may be made of the same metal or different metals.

Figure 7:
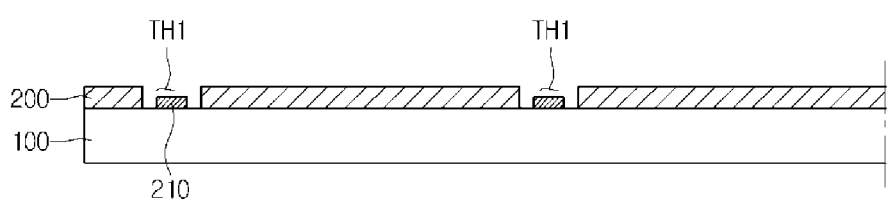
Figure 8:
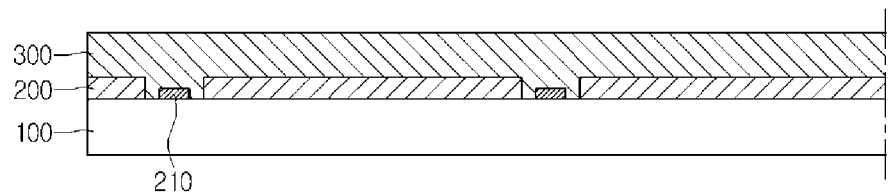

As shown in FIG. 7, the rear electrode layer 200 has first through-grooves TH1 defined therein. The first through-grooves TH1 may partially expose a top face of the support substrate 100. When viewed from above, the first through-grooves TH1 may extend in a first direction in FIG. 1.

The first through-grooves TH1 may have a width of about 80 µm to about 200 µm.

The first through-grooves TH1 divide the rear electrode layer 200 into a multiple of rear sub-electrodes. That is, the multiple of the rear sub-electrodes may be defined by the first through-grooves TH1.

The rear sub-electrodes may be spaced from each other via the first through-grooves TH1. In one embodiment, each of the rear sub-electrodes may be formed in a stripe shape.

In an alternative, the rear sub-electrodes may be formed in a matrix shape. In this case, when viewed from above, the first through-grooves TH1 may be arranged in a lattice form.

The first through-grooves TH1 partially exposes a top face of the support substrate 100 to form respective exposed regions thereof. In the respective exposed regions, at least one protrusion 210 may be formed on the top face of the support substrate 100.

The protrusion 210 may be made of the same material as the rear electrode layer 200. In one example, the protrusion 210 may be made of molybdenum (Mo). In one example, the protrusion 210 may be made of at least one of molybdenum Mo and molybdenum diselenide ($MoSe_2$).

The protrusion 210 may be divided in a multiple of sub-protrusions which may be spaced from each other by a constant distance. In one example, the multiple of the sub-protrusions may be arranged along the extension direction of the first through-groove.

FIG. 4 and FIG. 5 illustrate respectively two examples of configurations of the sub-protrusions 210 disposed in each of the first through-grooves TH1.

Referring to FIG. 4, the sub-protrusions 210 may be arranged in each of the first through-grooves TH1 in a single row along the extension direction of each of first through-grooves TH.

In an alternative, referring to FIG. 5, the sub-protrusions 210 may be arranged in each of the first through-grooves TH1 in a multiple of rows along the extension direction of each of first through-grooves TH. In one example, the sub-protrusions 210 may be arranged in first and second rows 211 and 212 respectively.

As shown in FIG. 5, adjacent sub-protrusions 210 in the first and second rows 211 and 212 respectively may be arranged side by side. However, the present disclosure is not limited thereto. The adjacent sub-protrusions 210 in the first and second rows 211 and 212 respectively may be arranged in a staggering manner.

The protrusion 210 may be spaced from a side wall of each of the first through-grooves TH1 by a predetermined distance. The predetermined distance dl may be about 1 µm to about 10 µm. That is, the protrusion 210 may be spaced from an outer side wall of each of the rear sub-electrodes by about 1 µm to about 10 µm.

Further, the protrusion 210 may have a thickness smaller than that of the rear electrode layer 200. In one example, the protrusion 210 may have a thickness equal to or smaller than 1/10 of the thickness of the rear electrode layer 200.

Each of the sub-protrusions 210 may be formed in a seed shape. That is, the sub-protrusions 210 may be formed by forming the first through-grooves TH1 in the rear electrode layer 200, and depositing molybdenum seeds in each of the first through-grooves TH1 on the substrate 100.

In an alternative, the rear electrode layer 200 may be patterned using a patterned mask so as to form patterned protrusions 210 during forming the first through-grooves TH1.

The protrusion 210 may have a top face parallel to a top face of the support substrate 100. Alternatively, the protrusion 210 may have a convex or concave top face. In this case, a surface portion of the protrusion 210 may include molybdenum diselenide ($MoSe_2$) as described below.

Specifically, as shown in FIG. 3, the protrusion 210 may have an "a" portion made of molybdenum diselenide ($MoSe_2$). Further, the protrusion 210 may have a content gradient such that a content of the molybdenum diselenide gradually increases from a "b" portion to the "a" portion thereof.

That is, the protrusion 210 may have a content gradient such that a content of the molybdenum diselenide gradually increases from a bottom to a top thereof.

In the present disclosure, the protrusion may enhance a bonding force between the light absorption layer (as will be described) and the support substrate. In other words, the protrusion may enhance a bonding force between the light absorption layer filling the each of first through-grooves, and the support substrate partially exposed through the first through-grooves.

Conventionally, when a light absorption layer is formed on a rear electrode layer having first through-grooves defined therein, the first through-grooves may cause a poor bonding between the light absorption layer and the support substrate. Thus, the light absorption layer may be incompletely deposited on the support substrate, and, hence, may be peeled off from the substrate. This may lead to an increased electrical resistance of the solar cell structure, and, thus, poor overall efficiency thereof.

For this reason, regarding the solar cell structure of the present disclosure, an enhanced bonding force between the support substrate and light absorption layer may be achieved via the protrusion formed on an exposed top face of the support substrate through the first through-groove during or after forming the through-grooves, where the protrusion may be made of the same material as or different material from the rear electrode layer.

In this connection, the protrusion has a content configuration such that a content of the molybdenum diselenide increases from a bottom, that is, the support substrate side to a top, that is, the light absorption layer side thereof, compared to a molybdenum content. Further, the bonding force between the light absorption layer and molybdenum diselenide may be stronger than a bonding force between the light absorption layer and molybdenum. As a result, via the protrusion with the above content configuration, a boding force between the support substrate and light absorption layer may be enhanced.

In this way, the solar cell structure of the present disclosure may allow an enhanced boding force between the support substrate and light absorption layer, thereby to prevent the deposited light absorption layer from being peeled off.

Consequently, the solar cell structure of the present disclosure may have improved overall photovoltaic efficiency.

The light absorption layer 300 is disposed on the rear electrode layer 200. Further, the light absorption layer 300 material may also fill the first through-grooves TH1. That is, the light absorption layer 300 may contact the sub-protrusions 210 and, an exposed top face of the support substrate 100 through the first through-grooves TH1. Specifically, the light absorption layer 300 may contact outer faces, that is, top and side faces of each of the sub-protrusions 210.

The light absorption layer 300 may be made of a I-III-VI groups based compound. For example, the light absorption layer 300 may have a copper-indium-gallium-selenide (Cu(In,Ga)Se$_2$; CIGS) based crystal structure, a copper-indium-selenide based crystal structure, or a copper-gallium-selenide based crystal structure.

In this way, a contact between the light absorption layer 300 and the protrusion 210 including the molybdenum (Mo) may cause a contacting face portion of the protrusion 210 to be changed into molybdenum diselenide MoSe$_2$. Thus, as described above, the protrusion 210 containing a mixture of the molybdenum and molybdenum diselenide may have a content configuration such that a content of the molybdenum diselenide increases from a bottom, that is, the support substrate 100 side to a top, that is, the light absorption layer 300 side thereof, compared to a molybdenum content.

This may lead to a further enhanced bonding force between the protrusion 210 and the light absorption layer 300 at an interface thereof due to the molybdenum diselenide contained in the protrusion 210. Thus, after the light absorption layer 300 has been deposited on the exposed top face of the support substrate 100 through the first through-grooves TH1, the light absorption layer 300 may be prevented from be peeled off.

The light absorption layer 300 may have an energy band gap of about 1 eV to 1.8 eV.

Thereafter, the buffer layer 400 is disposed on the light absorption layer 300. The buffer layer 400 may contact the light absorption layer 300.

On the buffer layer 400, the high resistance buffer layer (not shown) may be further disposed. The high resistance buffer layer may be made of a zinc oxide (i-ZnO) without doped impurities therein. The high resistance buffer layer may have an energy band gap of about 3.1 eV to 3.3 eV.

The buffer layer 400 may have second through-grooves TH2 defined therein. The second through-grooves TH2 partially exposes a top face of the rear electrode layer 200. When viewed from above, each of the second through-grooves TH2 may extend in one direction. Each of the second through-grooves TH2 may have a width of about 80 μm to about 200 μm. However, the present disclosure is not limited thereto.

The buffer layer 400 may be divided via the second through-grooves TH2 into a multiple of buffer sub-layers. That is, the second through-grooves TH2 may define the multiple buffer sub-layers.

The front electrode layer 500 is disposed above the buffer layer 400. Specifically, the front electrode layer 500 is disposed on the high resistance buffer layer (not shown). The front electrode layer 500 is transparent and electrically conductive. Further, the front electrode layer 500 may have a higher electrical resistance than that of the rear electrode layer 500.

The front electrode layer 500 may include an oxide. In one example, the front electrode layer 500 may be made of a zinc oxide with doped aluminum therein (Al doped ZnO; AZO), an indium zinc oxide (IZO), or an indium tin oxide (ITO), etc.

The front electrode layer 500 material may fill the second through-grooves TH2 to form the connections 600 respectively.

The buffer layer 400 and the front electrode layer 500 have third through-grooves TH3 defined therein. Each of the third through-grooves TH3 may pass through at least partially the buffer layer 400, the high resistance buffer layer and the front electrode layer 500. In this way, the third through-grooves TH3 may partially expose a top face of the rear electrode layer 200.

Each of the third through-grooves TH3 may be adjacent to each of the second through-grooves TH2. Specifically, each of the third through-grooves TH3 may be disposed next to the second through-grooves TH2. In this connection, when viewed from above, each of the third through-grooves TH3 may be juxtaposed with each of the second through-grooves TH2. Each of the third through-grooves TH3 may extend in the first direction (in FIG. 1).

The third through-grooves TH3 may further pass through the front electrode layer 500. Specifically, the third through-grooves TH3 may pass through at least partially the light absorption layer 300, the buffer layer 400 and/or the high resistance buffer layer.

The third through-grooves TH3 may divide the front electrode layer 500 into a multiple of front sub-electrode. That is, the front sub-electrodes may be defined by the third through-grooves TH3.

The front sub-electrodes may correspond in a shape with the rear sub-electrodes. In other words, the front sub-electrodes may be arranged in a stripe form. In an alternative, the front sub-electrodes may be arranged in a matrix form.

Further, the third through-grooves TH3 may define a multiple of solar cells C1, C2 and so on. Specifically, a combination of the second through-grooves TH2 and third through-grooves TH3 may define the solar cells C1, C2, and so on. That is, a combination of the second through-grooves TH2 and the third through-grooves TH3 may divide the solar cell structure of the present disclosure into the solar cells C1, C2, and so on. Further, each of the solar cells C1, C2, and so on may extend in the first direction. The solar cells C1, C2, and so on may be arranged and connected to each other in a second direction perpendicular to the first direction. Thus, an electrical current may flow via the solar cells C1, C2, and so on in the second direction.

In this way, the solar cell panel 10 includes the support substrate 100, and the solar cells C1, C2 and so on. The solar cells C1, C2 and so on are disposed and spaced from each other on the support substrate 100. In this connection, the solar cells C1, C2 and so on may be connected to each other via the connections 600 in a series.

The connections 600 may be formed in the second through-grooves TH2 respectively. Each of the connections 600 may extend downwards from the front electrode layer 500 to the rear electrode layer 200. For example, a first connection of the connections 600 may extend downwards from a front sub-electrode of the first cell C1 to a rear sub-electrode of the second cell C2.

In this way, each of the connections 600 may connect adjacent solar cells to each other. Specifically, each of the connections 600 may connect front and rear sub-electrodes in adjacent cells respectively.

The connection 600 may be monolithic with the front electrode layer 600. In other words, the connection 600 material may be the same as the front electrode layer 500 material.

As described above, the solar cell structure of the present disclosure is configured such that each of the protrusions formed on an exposed top face of the support substrate through the first through-grooves contains a mixture of the molybdenum and molybdenum diselenide.

In particular, each of the protrusions may have a content configuration such that the molybdenum diselenide content increases toward a top portion thereof, that is, toward the light absorption layer. This may lead to an improved bonding force between the light absorption layer and support substrate in each of the first through-grooves In this way, the improved bonding force between the support substrate and light absorption layer may prevent the deposited light absorption layer from being peeled off. The solar cell structure of the present disclosure may have improved overall photovoltaic efficiency.

FIG. 6 to FIG. 12 illustrate respectively cross-sectional views describing a method of manufacturing a solar cell structure of one embodiment of the present disclosure. Hereinafter, referring to FIG. 6 to FIG. 12, the method of manufacturing a solar cell structure of one embodiment of the present disclosure will be described in details. In a following description, the same components as the above description are designated with the same reference numerals.

Figure 6:
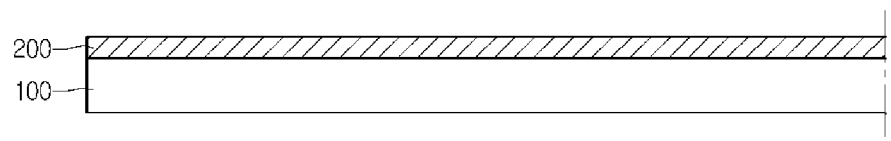
FIG. 6 to FIG. 12 illustrate respectively cross-sectional views describing a method of manufacturing a solar cell structure of one embodiment of the present disclosure.

First, referring to FIG. 6, on the support substrate 100, a rear electrode layer 200 is formed.

Then, referring to FIG. 7, the rear electrode layer 200 is patterned to be divided into a multiple of rear sub-electrodes via the first through-grooves TH1 defined therein. In this connection, the rear electrode layer 200 may be patterned using a laser.

After defining the first through-grooves TH1, a plurality of sub-protrusions 210 may be formed in each of the first through-grooves TH1 using a nano-laser. Alternatively, the patterned protrusions 210 may be formed in each of the first through-grooves TH1 at the same time as when forming the first through-grooves TH1 using a patterned mask.

The sub-protrusions 210 may be made of the same material as the rear electrode layer 200. In other words, the sub-protrusions 210 may include molybdenum.

The first through-grooves TH1 partially expose a top face of the support substrate 100. Each first groove may have a width of about 80 µm to about 200 µm.

Further, in one example, between the support substrate 100 and the rear electrode layer 200, there may be formed an additional layer such as a diffusion-inhibition layer or the like. In this connection, the first through-grooves TH1 may partially expose a top face of the additional layer Thereafter, referring to FIG. 8, on the rear electrode layer 200 divided into the rear sub-electrodes, the light absorption layer 300 is formed. The light absorption layer 300 may be formed using a sputtering process or an evaporation method.

For example, in order to form the light absorption layer 300, two approaches may be widely employed: in a first one, an evaporation of copper, indium, gallium, and selenium at the same time or individually may form a copper-indium-gallium-selenide ($Cu(In,Ga)Se_2$; CIGS) based light absorption layer 300; and in a second one, a metal precursor layer is formed, and, thereafter, a selenization process may be conducted to the precursor layer to form the light absorption layer 300.

Regarding details about the above second approach, first, the metal precursor layer may be formed on the rear electrode 200 by a sputtering process of copper, indium, and gallium targets.

After this, the metal precursor layer may be subjected to the selenization process to form the copper-indium-gallium-selenide ($Cu(In,Ga)Se_2$; CIGS) based light absorption layer 300.

In an alternative, the sputtering process of the copper, indium, and gallium targets may occur concurrently with the selenization process.

In a further alternative, a sputtering process of the copper, and indium targets or a sputtering process of the copper, and gallium targets together with the selenization process may create a CIS based or CIG based light absorption layer 300 respectively.

The light absorption layer 300 may be formed on the rear electrode layer 200, and in the first through-grooves TH1. In other words, the light absorption layer 300 formed in the first through-grooves TH1 may contact an exposed top face of the support substrate 100 through the first through-grooves TH1, and the sub-protrusions 210.

Further, the contact between the light absorption layer 300 and the sub-protrusion 210 containing molybdenum (Mo) may cause a contacting face portion of the sub-protrusion 210 to be changed into molybdenum diselenide $MoSe_2$. That is, a contacting face portion of the protrusion 210 may include molybdenum diselenide. Thus, as described above, the sub-protrusion 210 containing a mixture of molybdenum and molybdenum diselenide may have a content configuration such that a content of the molybdenum diselenide increases from a bottom, that is, the support substrate 100 side to a top, that is, the light absorption layer 300 side thereof, compared to a molybdenum content.

Figure 9:
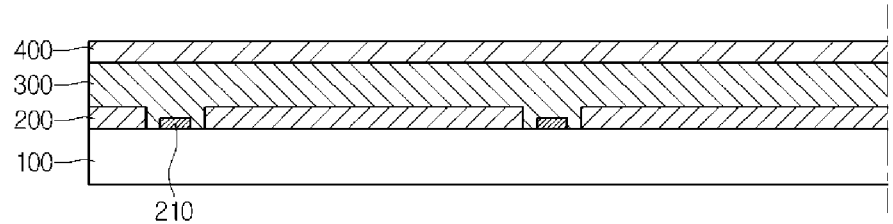

Next, referring to FIG. 9, a cadmium sulfide may be deposited on the layer 300 using a sputtering process or a chemical bath deposition (CBD) or the like to form the buffer layer 400.

Thereafter, on the buffer layer 400, a zinc oxide may be deposited using a deposition process, such that the high resistance buffer layer may be formed on the buffer layer 400.

The high resistance buffer layer may be formed using a chemical vapor deposition (CVD), an organic metal chemical vapor deposition (MOCVD) or an atomic layer deposition (ALD). Preferably, the high resistance buffer layer may be formed using the MOCVD method.

Figure 10:
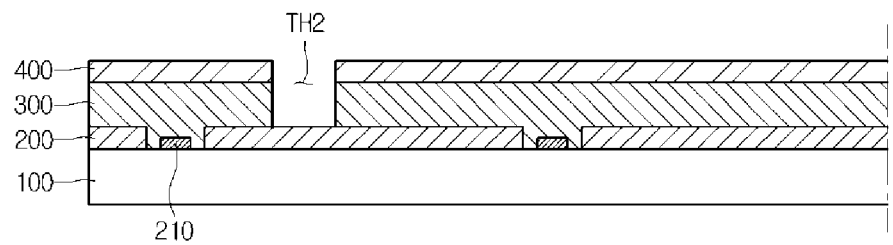

Then, referring to FIG. 10, the light absorption layer 300 and the buffer layer 400 may be partially removed away to form the second through-grooves TH2.

The second through-grooves TH2 may be formed using a mechanical or laser apparatus or the like.

For example, a tip device having a width of about 40 µm to about 180 µm may pattern the light absorption layer 300 and the buffer layer 400. In an alternative, the second through-grooves TH2 may be formed using a laser with a wavelength of about 200 nm to about 600 nm.

In this connection, the second through-grooves TH2 may have a width of about 100 µm to about 200 µm. Further, the second through-grooves TH2 may partially expose a top face of the rear electrode layer 200.

Figure 11:
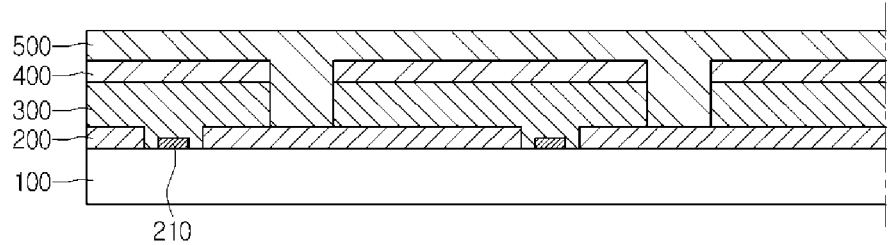

Then, referring to FIG. 11, on the buffer layer 400, there may be deposited a transparent conductive material to form the front electrode layer 500.

The front electrode layer 500 may be formed by a deposition of the transparent conductive material in an oxygen-free environment. Specifically, the front electrode layer 500 may be formed by a deposition of an aluminum-doped zinc oxide in an inert and oxygen-free gas atmosphere.

The formation of the front electrode layer may include a RF sputtering of a ZnO target, or a deposition of an aluminum-doped zinc oxide using a reactive ion sputtering of a Zn target.

Figure 12:
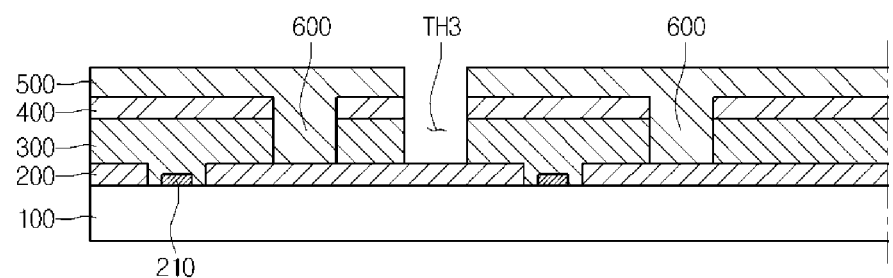

Thereafter, referring to FIG. 12, the light absorption layer 300, the buffer layer 400 and the front electrode layer 500 may be partially removed away to form the third through-grooves TH3. Those grooves TH3 may pattern the front electrode layer 500 to be divided into a multiple of the front sub-electrodes, and, thus, to define the first cell C1, second cell C2, third cell C3, and so on. The third through-grooves TH3 may have a width of about 80 µm to about 200 µm.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A solar cell device comprising:
   a support substrate;
   a plurality of rear electrode layers on the substrate;
   a light absorption layer on the rear electrode layers; and
   a front electrode layer on the light absorption layer;
   wherein the rear electrode layers comprise a first rear electrode layer and a second rear electrode layer,
   wherein a through-hole is disposed between the first rear electrode layer and the second rear electrode layer,
   wherein the through-hole extends in a first direction and the through-hole is disposed between the first rear electrode layer and the second rear electrode layer in a second direction perpendicular to the first direction,
   wherein a plurality of protrusions is disposed on a top face of the substrate and in the through-hole,
   wherein each protrusion includes a first side surface, a second side surface, and a top face connecting the first and second side surfaces in the second direction,
   wherein the plurality of protrusions is made of a same material as that of the rear electrode layers,
   wherein a portion of the light absorption layer directly contacts the top face of the substrate via the through-hole, and directly contacts the protrusions in the through-hole,
   wherein the light absorption layer directly contacts the first side surface and the second side surface of each of the protrusions,
   wherein the light absorption layer directly contacts the top face of each of the protrusions along the entirety of the top face of each of the protrusions,
   wherein the top faces of the protrusions are disposed lower than top faces of the rear electrode layers,
   wherein the plurality of protrusions comprises a plurality of first protrusions arranged in a first row extending in the first direction of the through-hole and a plurality of second protrusions arranged in a second row extending in the first direction of the through-hole,
   wherein the protrusions of the plurality of first protrusions are spaced from each other in the first direction in the first row, and the protrusions of the plurality of second protrusions are spaced from each other in the first direction in the second row, and
   wherein the plurality of first protrusions and the plurality of second protrusions are arranged side by side.

2. The device of claim 1, wherein the plurality of protrusions is made of molybdenum.

3. The device of claim 1, wherein the plurality of protrusions is made of at least one of molybdenum (Mo) and molybdenum diselenide ($MoSe_2$).

4. The device of claim 1, wherein each of the plurality of protrusions is spaced from a side surface of the first rear electrode layer and a side surface of the second rear electrode layer.

5. The device of claim 1, wherein the plurality of protrusions has a thickness smaller than thicknesses of the rear electrode layers.

6. The device of claim 1, wherein each of the plurality of protrusions has a thickness equal to or smaller than 1/10 of thicknesses of the rear electrode layers.

7. The device of claim 1, wherein the top faces of the protrusions are in parallel to the top face of the support substrate.

8. The device of claim 1, wherein the plurality of protrusions has a top face portion including molybdenum diselenide ($MoSe_2$).

9. The device of claim 8, wherein a content of the plurality of protrusions is such that the molybdenum diselenide ($MoSe_2$) content increases from a bottom face to the top face portion, wherein the bottom face contacts the substrate.

* * * * *